(12) United States Patent
Eliashevich et al.

(10) Patent No.: US 7,023,022 B2
(45) Date of Patent: Apr. 4, 2006

(54) MICROELECTRONIC PACKAGE HAVING IMPROVED LIGHT EXTRACTION

(75) Inventors: Ivan Eliashevich, Maplewood, NJ (US); Robert F. Karlicek, Flemington, NJ (US); Hari Venugopalan, Somerset, NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 10/416,996

(22) PCT Filed: Nov. 14, 2001

(86) PCT No.: PCT/US01/44047

§ 371 (c)(1),
(2), (4) Date: Nov. 20, 2003

(87) PCT Pub. No.: WO02/41406

PCT Pub. Date: May 23, 2002

(65) Prior Publication Data

US 2004/0065886 A1   Apr. 8, 2004

Related U.S. Application Data

(60) Provisional application No. 60/249,311, filed on Nov. 16, 2000.

(51) Int. Cl.
*H01L 33/00* (2006.01)

(52) U.S. Cl. .................. 257/98; 257/81; 257/100; 257/676; 257/680; 438/22; 438/23; 438/24; 313/501; 313/512

(58) Field of Classification Search ............. 257/81, 257/98, 100, 676, 680, 778; 438/22–27; 313/501, 512
See application file for complete search history.

(56) References Cited

U.S. PATENT DOCUMENTS

| | | | |
|---|---|---|---|
| 5,689,279 A | 11/1997 | Nelson et al. | |
| 5,779,924 A * | 7/1998 | Krames et al. | ............... 216/24 |
| 6,034,424 A | 3/2000 | Fujimura et al. | |
| 6,274,890 B1 | 8/2001 | Oshio et al. | |
| 6,278,136 B1 * | 8/2001 | Nitta | ............ 257/99 |
| 6,310,364 B1 * | 10/2001 | Uemura | ............ 257/100 |

FOREIGN PATENT DOCUMENTS

| | | |
|---|---|---|
| EP | 0 107 480 A2 | 5/1984 |
| JP | 03-016279 * | 1/1991 |

* cited by examiner

*Primary Examiner*—Donghee Kang
(74) *Attorney, Agent, or Firm*—Lerner, David, Littenberg, Krumholz & Mentlik, LLP

(57) ABSTRACT

A light-emitting package includes a substantially transparent substrate having a first surface and a second surface including a lens. The package also includes a light-emitting diode (LED) adapted to emit light having a predetermined wavelength, the LED being secured over the first surface of the substantially transparent substrate. The second surface of the substrate defines a principal light emitting surface of the package. The lens at the second surface has a grating pattern that matches the predetermined wavelength of the light emitted from the LED for controlling the emission geometry of the light emitted by the package. The grating pattern has a radial configuration including a series of circles that are concentric.

17 Claims, 4 Drawing Sheets

MICROELECTRONIC PACKAGE HAVING IMPROVED LIGHT EXTRACTION

This application claims the benefit of PCT/US 01/44047, filed Nov. 14, 2001, which claims the benefit of U.S. Provisional Application No. 60/249,311, filed Nov. 16, 2000, the disclosures of which are hereby incorporated by reference herein.

The present invention relates to making semiconductor packages and particularly relates to methods of making light emitting diodes packages having optimized light extraction characteristics.

BACKGROUND OF THE INVENTION

Referring to FIG. 1, conventional light emitting diodes or "LEDs" include thin layers of semiconductor material of two opposite conductivity types, typically referred to as p-type layers 20 and n-type layers 22. The layers 20, 22 are typically disposed in a stack, one above the other, with one or more layers of n-type material in one part of the stack and one or more layers of p-type material at an opposite end of the stack. Each LED includes a junction 24 provided at the interface of the p-type and n-type layers. The various layers of the stack may be deposited in sequence on a substantially transparent substrate 26, such as a sapphire substrate, to form a wafer. The wafer is then cut apart to form individual dies which constitute separate LEDs.

In operation, electric current passing through the LED package is carried principally by electrons in the n-type layer 22 and by electron vacancies or "holes" in the p-type layer 24. The electrons and holes move in opposite directions toward the junction 24, and recombine with one another at the junction. Energy released by electron-hole recombination is emitted from the LED as light 28. As used herein, the term "light" includes visible light rays, as well as light rays in the infrared and ultraviolet wavelength ranges. The wavelength of the emitted light 28 depends on many factors, including the composition of the semiconductor materials and the structure of the junction 24.

FIG. 2 shows a typical LED package 10 including p-type and n-type semiconductor layers 20, 22 mounted atop a substantially transparent substrate 26. The LED is surrounded by a substantially transparent encapsulant 30. Each layer of the package has its own unique index of refraction. As used herein, the term "refraction" means the optical phenomenon whereby light entering a transparent medium has its direction of travel altered. The LED 18 has an index of refraction designated $n_1$, the transparent substrate 26 has an index of refraction designated $n_2$ and the encapsulant layer 30 has an index of refraction designated $n_3$. Because the index of refraction $n_2$ of the substantially transparent substrate 26 is greater than the index of refraction $n_3$ of the transparent encapsulant 30, many of the light rays generated by LED 18 will not be emitted from the LED package 10, but will be subject to total internal reflection. The optical phenomenon, known as total internal reflection, causes light incident upon a medium having a lesser index of refraction (e.g. encapsulant layer) to bend away from the normal so that the exit angle is greater than the incident angle. The exit angle will then approach 90° for some critical incident angle $\theta_c$, and for incident angles $\theta_i$ greater than critical angle $\theta_c$ there will be total internal reflection of the light ray. The critical angle can be calculated using Snell's Law. Referring to FIG. 2, a light ray subject total internal reflection is designated as light ray 32.

Thus, in many LED packages the light rays generated by the LED are never emitted from the package because such light rays are totally internally reflected within the package. Thus, there is a need for LED packages having designs that optimize the amount of light that may be extracted from the packages. There is also a need for LED packages having means for tailoring the emission geometry for higher efficiency in advanced packages.

SUMMARY OF THE INVENTION

In accordance with certain preferred embodiments of the present invention, a light-emitting diode (LED) package includes a substantially transparent substrate, such as a sapphire substrate, having a first surface and a second surface remote therefrom. The second surface of the substrate includes a lens. The lens at the second surface of the substantially transparent substrate preferably includes at least one radial surface. In other words, the lens defines a convex surface having an apex at a remote point from the first surface of the substantially transparent substrate. In other preferred embodiments, the lens may include an array of micro-lenses provided at the second surface of the substantially transparent substrate, each of the micro-lenses including a radial or convex surface.

The light emitting diode package also includes a light emitting diode secured over the first surface of the substantially transparent substrate so that the second surface of the substantially transparent substrate is remote from the light emitting diode. The light emitting diode preferably emits light that is extracted from the package. In one preferred embodiment the light emitting diode emits light having a predetermined wave length and the lens includes a grating pattern that is matched to the wave length of light emitted by the light emitting diode so as to control the emission geometry of the light emitted by the package. The grating pattern may have a radial configuration or a linear configuration wherein the gratings are substantially parallel to one another. In other embodiments, the grating pattern may include a series of ridges formed on the second surface of the substantially transparent substrate. In still other embodiments, the lens may be a fresnel lens formed at the second surface of the substantially transparent substrate. All of the above-mentioned lenses may be formed using a subtractive etching process that removes a portion of the substantially transparent substrate. In other embodiments, the lens may be formed by using an additive process that deposits material over the second surface of the substantially transparent substrate.

The LEDs may include materials selected from the group consisting of semiconductors such as III–V semiconductors, as for example, materials according to the stoichiometric formula $Al_aIn_bGa_cN_xAs_yP_z$ where (a+b+c) is about 1 and (x+y+z) is also about 1. Most typically, the semiconductor materials are nitride semiconductors, i.e., III–V semiconductors in which x is 0.5 or more, most typically about 0.8 or more. Most commonly, the semiconductor materials are pure nitride semiconductors, i.e., nitride semiconductors in which x is about 1.0. The term "gallium nitride based semiconductor" as used herein refers to a nitride based semiconductor including gallium. The p-type and n-type conductivity may be imparted by conventional dopants and may also result from the inherent conductivity type of the particular semiconductor material. For example, gallium nitride based semiconductors typically are inherently n-type even when undoped. N-type nitride semiconductors may include conventional electron donor dopants such as Si, Ge, S, and O, whereas p-type nitride semiconductors may include conventional electron acceptor dopants such as Mg and Zn. The substrate is preferably substantially transparent and may be selected from a group of materials including sapphire, GaN, AlN, ZnO and LiGaO. In certain preferred embodiments, the LEDs are GaN LEDs and the substrate is made of sapphire.

The light emitting diode package is preferably adapted to be flip-chip mounted to a microelectronic element, such as a printed circuit board, so that the second surface of the substantially transparent substrate overlies the light emitting diode portion of the package and so that the second surface of the substantially transparent substrate faces away from the microelectronic element. The package may also include a substantially transparent encapsulant encapsulating at least a portion of the substantially transparent substrate. In certain preferred embodiments, the transparent encapsulant covers both the substantially transparent substrate and the light emitting diode. The substantially transparent encapsulant may also encapsulate any conductive elements used to electrically interconnect the light emitting diode package with the microelectronic element. The substantially transparent encapsulant may include epoxies, elastomers and polymers.

In other preferred embodiments of the present invention, a method for making a light emitting diode package includes providing a substantially transparent substrate having a first surface and a second surface, mounting a light emitting diode over the first surface of the substantially transparent substrate, and forming a lens at the second surface of the substantially transparent substrate for optimizing light extraction from the package. The method may also include flip-chip mounting the light emitting diode package to a microelectronic element so that the lens at the second surface of the substantially transparent substrate is remote from the microelectronic element. The method also preferably includes encapsulating the light emitting diode package with a substantially transparent encapsulant such as an epoxy, elastomer and polymer. The encapsulant may be provided in a liquid form and then cured. These and other preferred embodiments of the present invention will be described in more detail below.

DETAILED DESCRIPTION OF THE PREFERRED EMBODIMENTS

Figure 1:
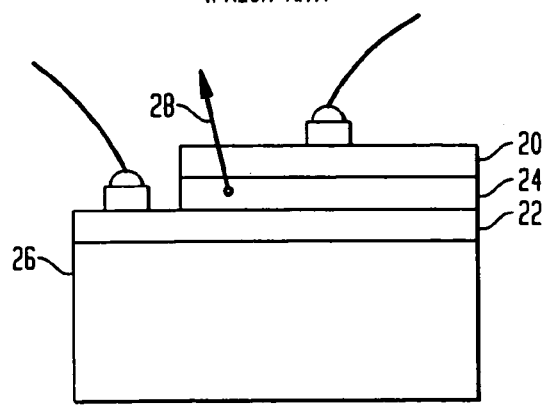
FIG. 1 shows a front elevation view of a conventional light emitting diode (LED) having a p-type layer, an n-type layer and a substantially transparent substrate.
Figure 2:
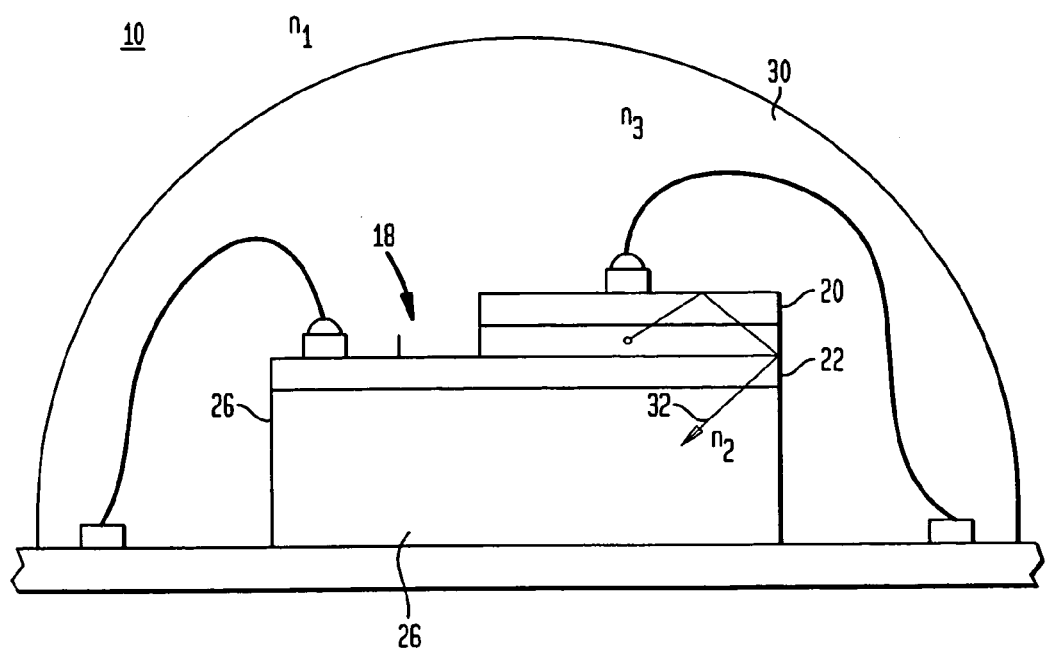
FIG. 2 shows a front elevation view of a conventional LED package including the LED of FIG. 1 mounted atop a microelectronic element and sealed in an encapsulant.
Figure 3:
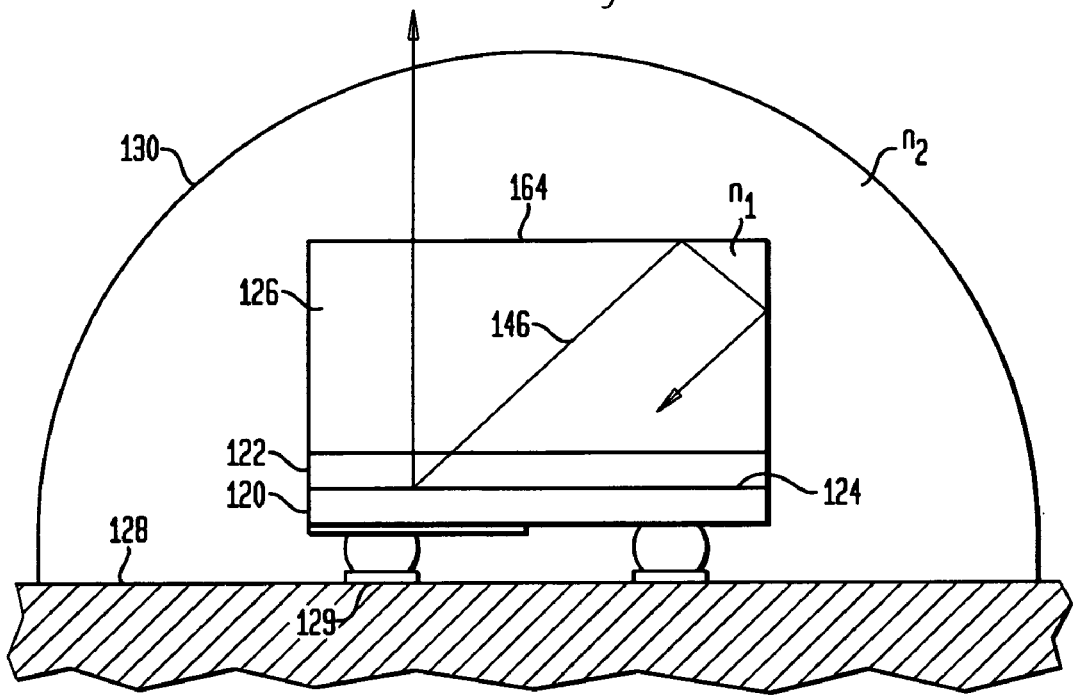
FIG. 3 shows a front elevation view of a conventional LED package.

FIG. 3 shows a front elevation view of a conventional flip-clip LED package including a LED having a semiconductor material of a first conductivity type in a lower region 120 and a second conductivity type in an upper region 122. The lower region 120 may be formed from a p-type semiconductor material whereas the upper region 122 may be formed from an n-type semiconductor material. The LED includes a junction 124 between the lower region 120 and the upper region 122. The lower and upper regions 120, 122 may abut one another so that they define the junction 124 at their mutual border. In alternative embodiments, however, the junction 124 may include multi-layered structures in the mutually adjacent portions of regions 120, 122 or between these regions. Thus, the junction 124 may be a simple homojunction, a single heterojunction, a double heterojunction, a multiple quantum well or any other type of junction structure. The upper region 122 may incorporate a "buffer layer" at the interface with substantially transparent substrate 126.

The LED is preferably flip-chip mounted atop a substrate 128 having contacts 129 and encapsulated in a substantially transparent encapsulant material 130 to form a LED package. The characteristics of encapsulant layer 130 are selected so that light generated by the LED may be emitted from the package. Encapsulant layer 130 has an index of refraction $n_2$ that is less than the index of refraction $n_1$ of transparent substrate 126. As a result, when the incident angle $\theta_i$ of a light ray 146 at interface 164 is greater than the critical angle $\theta_c$, the light ray 146 is totally internally reflected back into the substrate 126 and does not pass into the encapsulant layer 130 where the ray can be emitted from the LED package 128. As a result, many of the light rays generated by the LED are never emitted from encapsulant layer 130 of the LED package. Thus, there is a need for a LED package design which optimizes the amount of light that may be extracted from the package.

Figure 4:
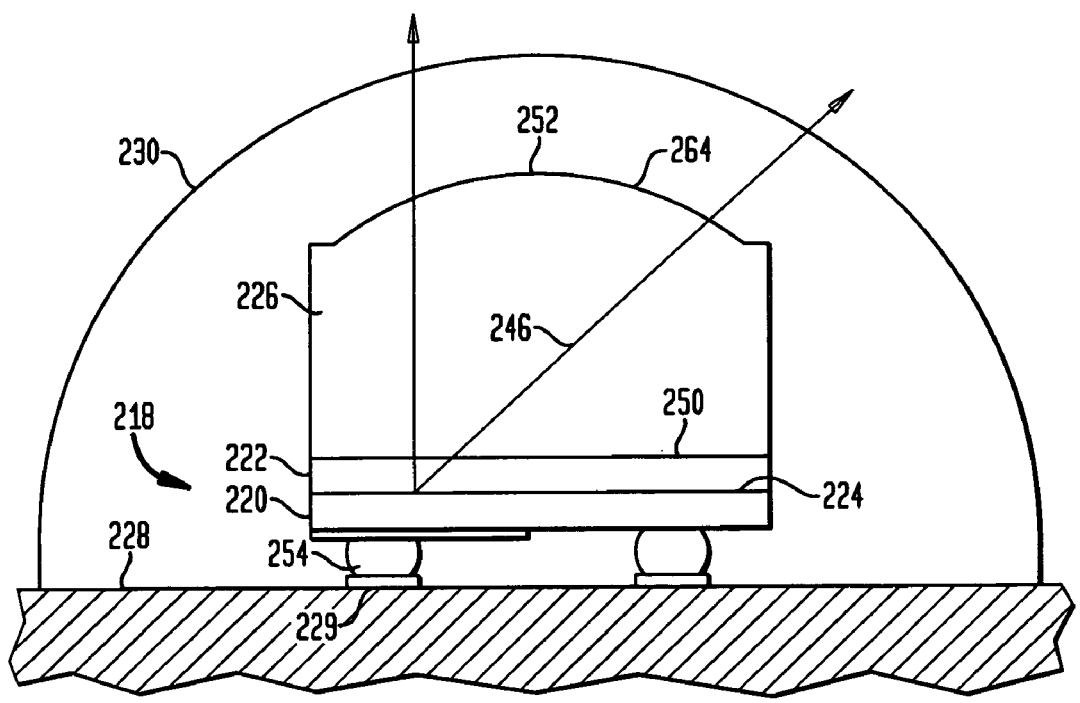
FIG. 4 shows a front elevation view of a LED package, in accordance with certain preferred embodiments of the present invention.

FIG. 4 shows a flip-chip mounted LED package including a lens formed on a second surface of a substantially transparent substrate for optimizing the amount of light extracted from the package. The LED package includes LED 218 having first layer 220, second layer 222, and junction 224 between the first and second layers. In certain preferred embodiments, LED 218 is preferably a GaN LED. The LED package includes substantially transparent substrate 226 such as a sapphire substrate having a first surface 250 and a second surface 252 remote from first surface 250. During assembly, the second layer 222 of LED 218 is abutted against the first surface 250 of substantially transparent substrate 226. The second surface 225 of substantially transparent substrate 226 preferably includes a lens having a convex or radial surface.

The LED package is preferably mounted atop substrate 228 having contacts 229. LED package may be electrically interconnected with substrate 228 using fusible conductive masses 254 such as solder balls. The electrically interconnected LED package may be encapsulated using substantially transparent encapsulant layer 230. The encapsulant 230 may be initially in a liquid state and may be cured to form a solid encapsulant layer. Preferred encapsulants include epoxies, elastomers and polymers.

Providing a flip-chip mounted LED package having a radial surface 252 optimizes the amount of light extracted from the package. For example, light ray 246 is emitted from junction 224 at substantially the same angle as light ray 246 shown in FIG. 3. However, because the second surface 252 of substrate 226 is convex, light ray 246 engages interface 264 at less than the critical angle and is able to pass through the interface 264 between substrate 226 and encapsulant layer 230.

Figure 5:
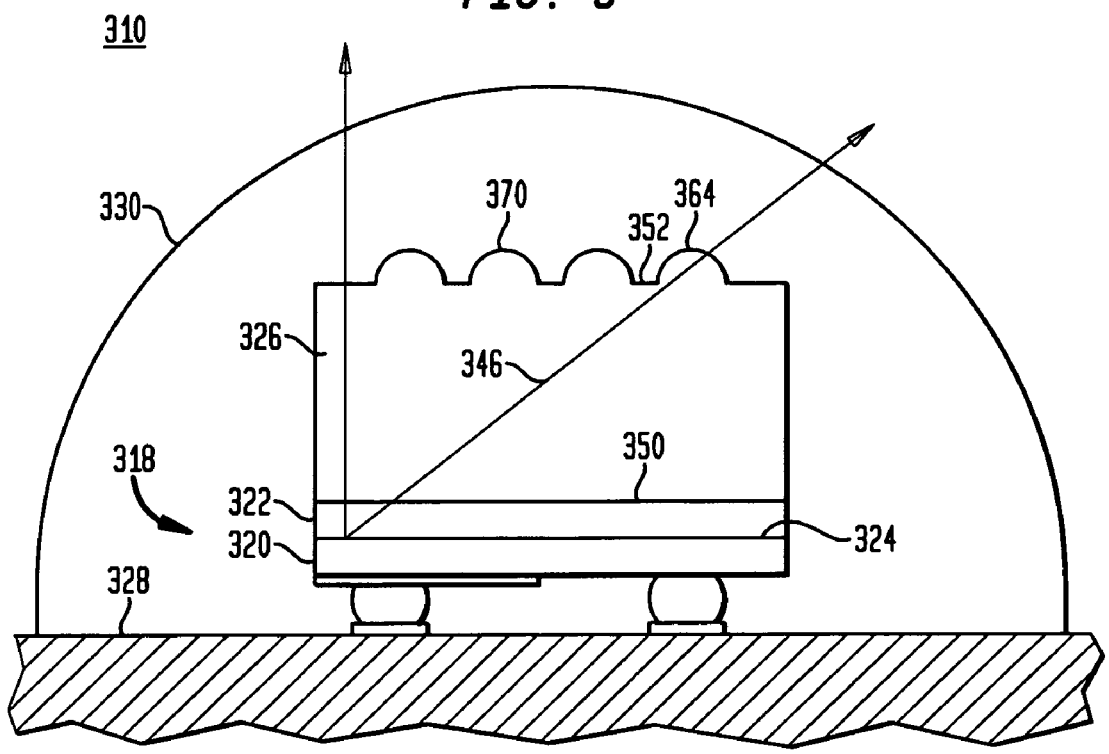
FIG. 5 shows front elevation view of a LED package, in accordance with further preferred embodiments of the present invention.

Referring to FIG. 5, a LED package 310 in accordance with another preferred embodiment of the present invention includes LED 318 having first surface 320 and second surface 322. LED 318 has a junction 324 extending between first and second layers 320, 322. LED package includes a substantially transparent substrate 326 having a first surface 350 and a second surface 352 remote therefrom. The second layer 322 of LED 318 is attached to first surface 350 of substantially transparent substrate 326. Second surface 352 of substrate 326 includes an array of microlenses 370 formed thereon. The microlenses may be formed at the second surface 352 using a subtractive etching process or by depositing material atop second surface 352.

In a conventional package, a light ray 346 generated at junction 324 of LED 318 would be totally and internally reflected back into substrate 326 if second surface 352 were substantially flat. However, due to the array of microlenses 370, the light ray 346 is able to pass through the interface 364 between substantially transparent substrate 326 and encapsulant layer 330. Thus, a flip-chip LED package having an array of microlenses formed on a second surface of a substantially transparent substrate results in a greater number of light rays escaping from the package 310.

Figure 6:
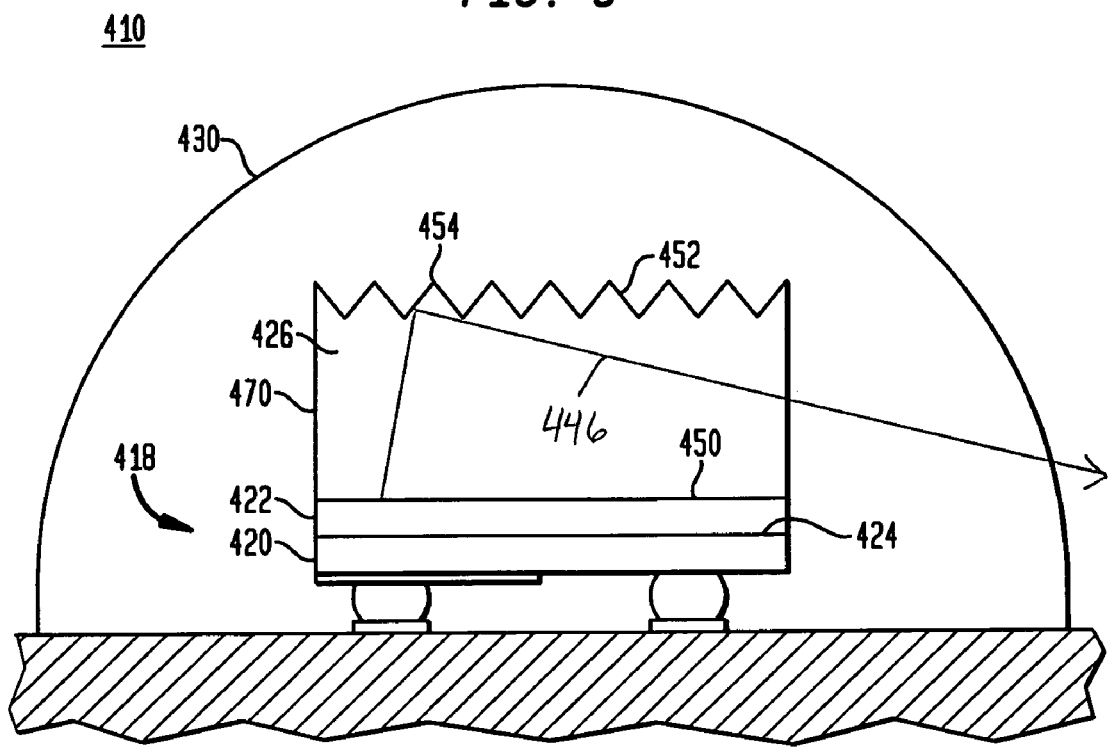
FIG. 6 shows a front elevation view of a LED package, in accordance with still further preferred embodiments of the present invention.

FIG. 6 shows a LED package including LED 418 having first layer 420 and second layer 422, with junction layer 424 extending therebetween. LED 410 includes a substantially transparent substrate 426 having a first surface 450 abutted against second layer 422 and second surface 452 remote therefrom. The second surface 452 of substantially transparent substrate 426 is subjected to a subtractive etching process or an additive process for forming a grating at second surface 452. The grating at second surface 452 increases the number of light rays emitted from the sides of the LED package 410. As shown in FIG. 6, light ray 446 strikes the interface 454 between substrate 426 and encapsulant layer 430. The granting directs light ray 446 through a side 470 of substrate 426 and passes through encapsulant layer 430. Although the present invention is not limited by any particular theory of operation, it is believed that providing a grating structure at second surface 452 optimizes the amount of light rays extracted from one or more sides of LED package 410.

Figure 7A:
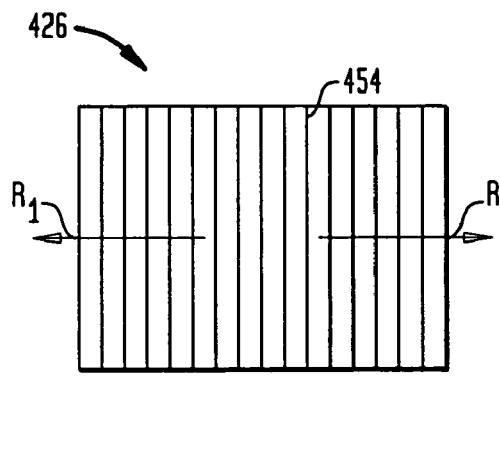
FIG. 7A shows a plan view of a substantially transparent substrate of a LED package, in accordance with certain preferred embodiments of the present invention.
Figure 7B:
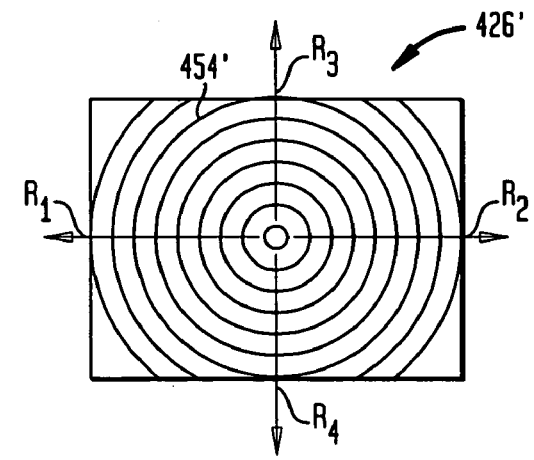
FIG. 7B shows a plan view of a substantially transparent substrate of a LED package, in accordance other preferred embodiments of the present invention.

Referring to FIGS. 7A and 7B, in accordance with certain preferred embodiments of the present invention, the grating pattern formed at the second surface of substantially transparent substrate 426 may have various configurations depending upon the desired light extraction characteristics for the package. In the embodiment shown in FIG. 7A, gratings 454 extend in directions substantially parallel to one another. Using this particular grating pattern, light generated at the junction of an LED will preferably be directed through sidewalls of an LED package in the directions indicated by arrows $R_1$ and $R_2$.

FIG. 7B shows another substantially transparent substrate 426' whereby the grating pattern 454' formed at the second surface of substrate 426' has a radial configuration including a series of concentric circles. In this particular embodiment, light generated at the junction of an LED will preferably be directed through sidewalls of an LED package in the directions indicated by arrows $R_1$–$R_4$. In other words, the light rays are preferably emitted from all sides of substantially transparent substrate 426'.

Figure 8:
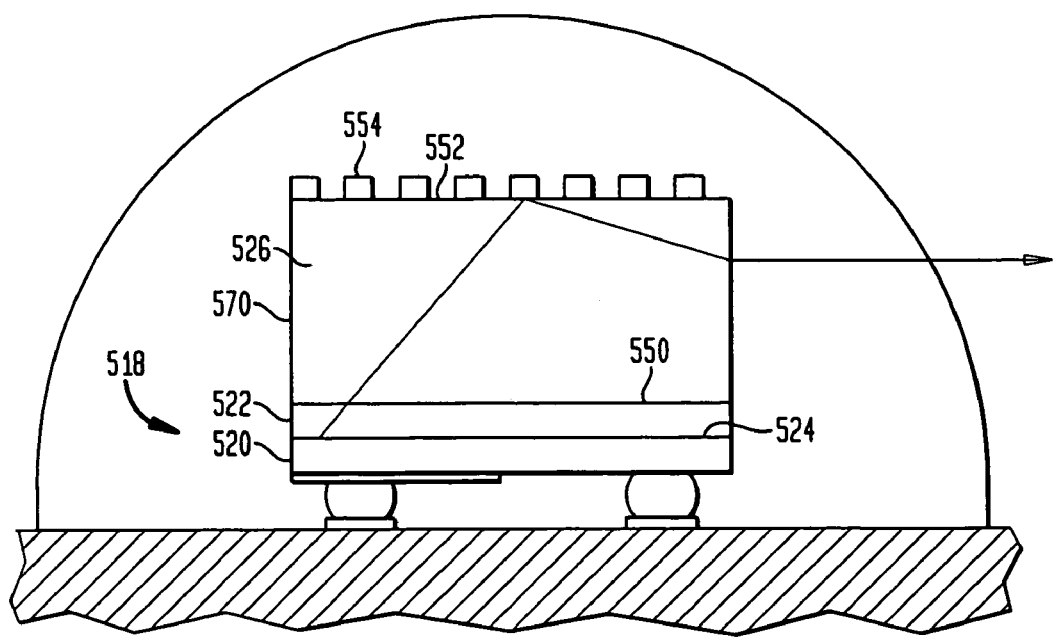
FIG. 8 shows a front elevation view of a LED package, in accordance with other preferred embodiments of the present invention.

FIG. 8 shows a LED package 510, in accordance with further preferred embodiments of the present invention. The LED package includes LED 518 having first layer 520, second layer 522 and junction 524 extending between first and second layer 520, 522. A substantially transparent substrate 526 is formed atop second layer 522 of LED 518. Substantially transparent substrate 526 includes first surface 550 and second surface 552 remote therefrom. A grating pattern 554 is formed atop second surface 552 of substrate 526. The grating pattern is preferably formed by an additive process that adds material to the second surface of the substrate 526. The grating pattern results in light rays generated by LED 518 being reflected through sidewall 570 of substantially transparent substrate 526. The pattern and/or spacing of the gratings 554 is matched with the wavelength of the light emitted from junction 524. In other word, the pattern of the grating 554 is matched with the wavelength of the LED 518 so that an optimum amount of light is transmitted through the sidewall 570 of substrate 526 and through the sides of LED package 510.

These and other variations and combinations of the features discussed above can be utilized without departing from the present invention. Thus, the foregoing description of the preferred embodiments should be taken by way of illustration rather than by way of limitation of the invention as defined by the claims.

What is claimed is:

1. A light-emitting package comprising:
    a substantially transparent substrate having a first surface and a second surface including a lens; and
    a light-emitting diode (LED) adapted to emit light having a predetermined wavelength, said LED being secured over the first surface of said substantially transparent substrate, wherein the second surface of said substrate defines a principal light emitting surface of said package, and wherein said lens at said second surface has a grating pattern that matches the predetermined wavelength of the light emitted from said LED for controlling the emission geometry of the light emitted by said package, wherein the grating pattern has a radial configuration including a series of circles, and wherein the series of circles are concentric circles.

2. The package as claimed in claim 1, wherein said package is flip-chip mountable to a microelectronic element so that the second surface of said substantially transparent substrate overlies the LED of said package and so that the second surface of said substantially transparent substrate is remote from said microelectronic element.

3. The package as claimed in claim 1, wherein the lens is formed using a subtractive etching process that removes a portion of the second surface of said substantially transparent substrate.

4. The package as claimed in claim 1, wherein the lens is formed using an additive process that deposits material over the second surface of said substantially transparent substrate.

5. The package as claimed in claim 1, wherein the lens is a fresnel lens formed using a subtractive etching process.

6. The package as claimed in claim 1, wherein said light emitting diodes comprise materials selected from the group consisting of III–V semiconductors.

7. The package as claimed in claim 1, wherein said substrate is selected from the group of materials consisting of sapphire, GaN, AlN, ZnO and LiGaO.

8. The package as claimed in claim 1, wherein said light emitting diode is a GaN light emitting diode and said substrate is made of sapphire.

9. A light emitting package comprising:
a substantially transparent substrate having a first surface and a second surface including a lens; and
a light emitting diode (LED) secured over the first surface of said substantially transparent substrate, wherein the second surface of said substrate defines a principal light emitting surface of said package, and wherein said lens includes a grating pattern having a radial configuration including a series of circles, and wherein the series of circles are concentric circles.

10. The package as claimed in claim 9, further comprising a substantially transparent encapsulant encapsulating at least a portion of said substantially transparent substrate.

11. A method of making a light emitting package comprising:
providing a substantially transparent substrate having a first surface and a second surface;
mounting a light emitting diode (LED) over the first surface of said substantially transparent substrate; and
forming a lens at the second surface of said substantially transparent substrate for optimizing light extraction from said package, wherein said lens has a grating pattern having a radial configuration including a series of circles, and wherein the series of circles are concentric circles.

12. The method as claimed in claim 11, further comprising flip-chip mounting said light emitting diode to a microelectronic element so that the lens at the second surface of said substantially transparent substrate is remote from said microelectronic element.

13. The method as claimed in claim 11, wherein said microelectronic element is a circuitized substrate.

14. The method as claimed in claim 11, further comprising encapsulating said light emitting package with a substantially transparent encapsulant.

15. The method as claimed in claim 11, wherein said substantially transparent encapsulant is a material selected from the group consisting of epoxies, elastomers and polymers.

16. The method as claimed in claim 11, wherein said light emitting diode comprises materials selected from the group consisting of III–V semiconductors.

17. The method as claimed in claim 11, wherein said substrate is selected from the group consisting of sapphire, GaN, AlN, ZnO and LiGaO.

* * * * *